United States Patent
Iwaya et al.

(10) Patent No.: US 10,269,534 B2
(45) Date of Patent: Apr. 23, 2019

(54) MASK POSITION ADJUSTMENT METHOD OF ION MILLING, ELECTRON MICROSCOPE CAPABLE OF ADJUSTING MASK POSITION, MASK ADJUSTMENT DEVICE MOUNTED ON SAMPLE STAGE AND SAMPLE MASK COMPONENT OF ION MILLING DEVICE

(71) Applicant: Hitachi High-Technologies Corporation, Minato-ku, Tokyo (JP)

(72) Inventors: Toru Iwaya, Tokyo (JP); Hisayuki Takasu, Tokyo (JP); Sakae Koubori, Tokyo (JP); Atsushi Kamino, Tokyo (JP); Kento Horinouchi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 11 days.

(21) Appl. No.: 15/547,315

(22) PCT Filed: Jan. 30, 2015

(86) PCT No.: PCT/JP2015/052614
§ 371 (c)(1),
(2) Date: Jul. 28, 2017

(87) PCT Pub. No.: WO2016/121080
PCT Pub. Date: Aug. 4, 2016

(65) Prior Publication Data
US 2018/0277335 A1    Sep. 27, 2018

(51) Int. Cl.
*H01J 37/20*    (2006.01)
*H01J 37/26*    (2006.01)
(Continued)

(52) U.S. Cl.
CPC ............ *H01J 37/20* (2013.01); *H01J 37/261* (2013.01); *H01J 37/305* (2013.01); *H01J 37/31* (2013.01)

(58) Field of Classification Search
CPC ........... H01J 37/20; H01J 37/261; H01J 37/31
(Continued)

(56) References Cited

U.S. PATENT DOCUMENTS 5,770,123 A * 6/1998 Hatakeyama ....... H01J 37/3056
219/121.6
2013/0220806 A1    8/2013 Iwaya et al.

FOREIGN PATENT DOCUMENTS

JP    2007-14996 A    1/2007
JP    2011-249246 A    12/2011
(Continued)

OTHER PUBLICATIONS

Japanese-language Office Action issued in counterpart Japanese Application No. 2016-571620 dated Jun. 5, 2018 with English translation (ten (10) pages).
(Continued)

*Primary Examiner* — Nicole M Ippolito
(74) *Attorney, Agent, or Firm* — Crowell & Moring LLP

(57) ABSTRACT

The present invention relates to adjustment of a mask position by driving an R-axis of an electron microscope in order to adjust the mask position with high accuracy while performing observation by the electron microscope without providing a heat generation source inside the electron microscope. The R-axis originally exists in a sample chamber of the electron microscope, which enables control with high accuracy. The R-axis driving of a sample stage can be substituted by raster rotation, therefore, the mask position
(Continued)

can be adjusted with high accuracy while performing observation by the electron microscope according to the present invention.

16 Claims, 14 Drawing Sheets

(51) Int. Cl.
*H01J 37/31* (2006.01)
*H01J 37/305* (2006.01)

(58) Field of Classification Search
USPC ........... 250/306, 307, 309, 310, 311, 440.11, 250/441.11, 443.1
See application file for complete search history.

(56) References Cited

FOREIGN PATENT DOCUMENTS

| | | |
|---|---|---|
| JP | 2014-143074 A | 8/2014 |
| WO | WO 2012/060416 A1 | 5/2012 |

OTHER PUBLICATIONS

International Search Report (PCT/ISA/210) issued in PCT Application No. PCT/JP2015/052614 dated Mar. 10, 2015 with English translation (four pages).
Japanese-language Written Opinion (PCT/ISA/237) issued in PCT Application No. PCT/JP2015/052614 dated Mar. 10, 2015 (three pages).

* cited by examiner

[FIG. 1]
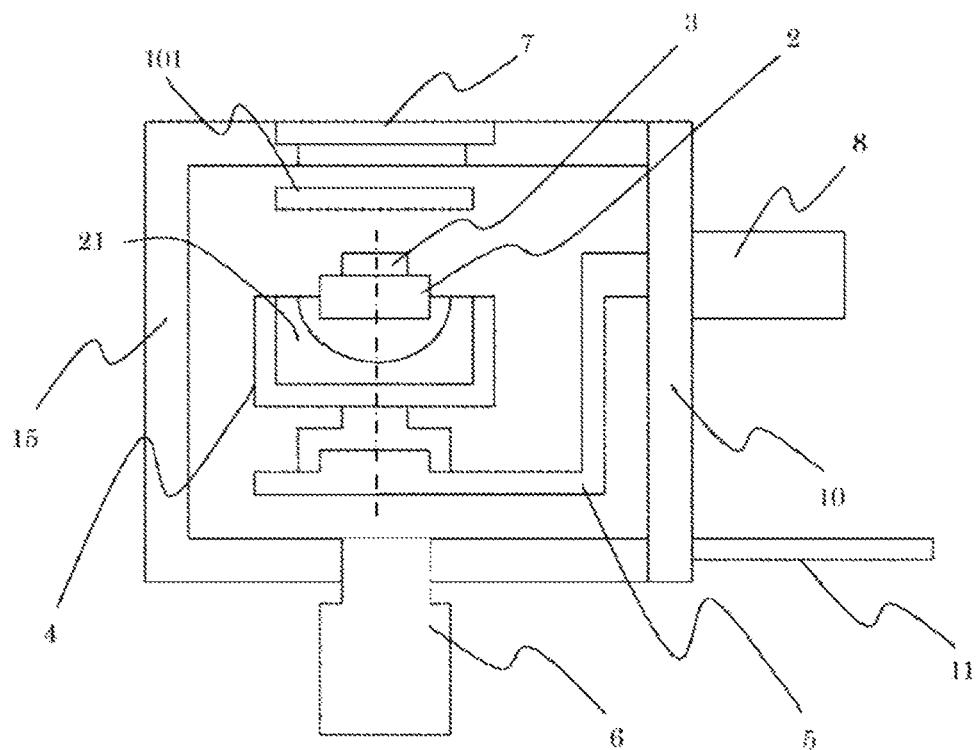
[FIG. 2]
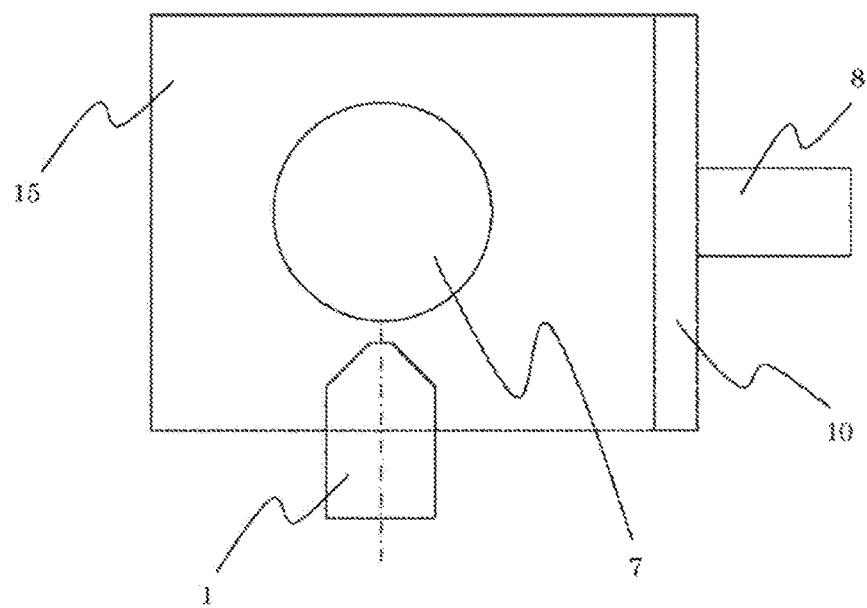

[FIG. 3]
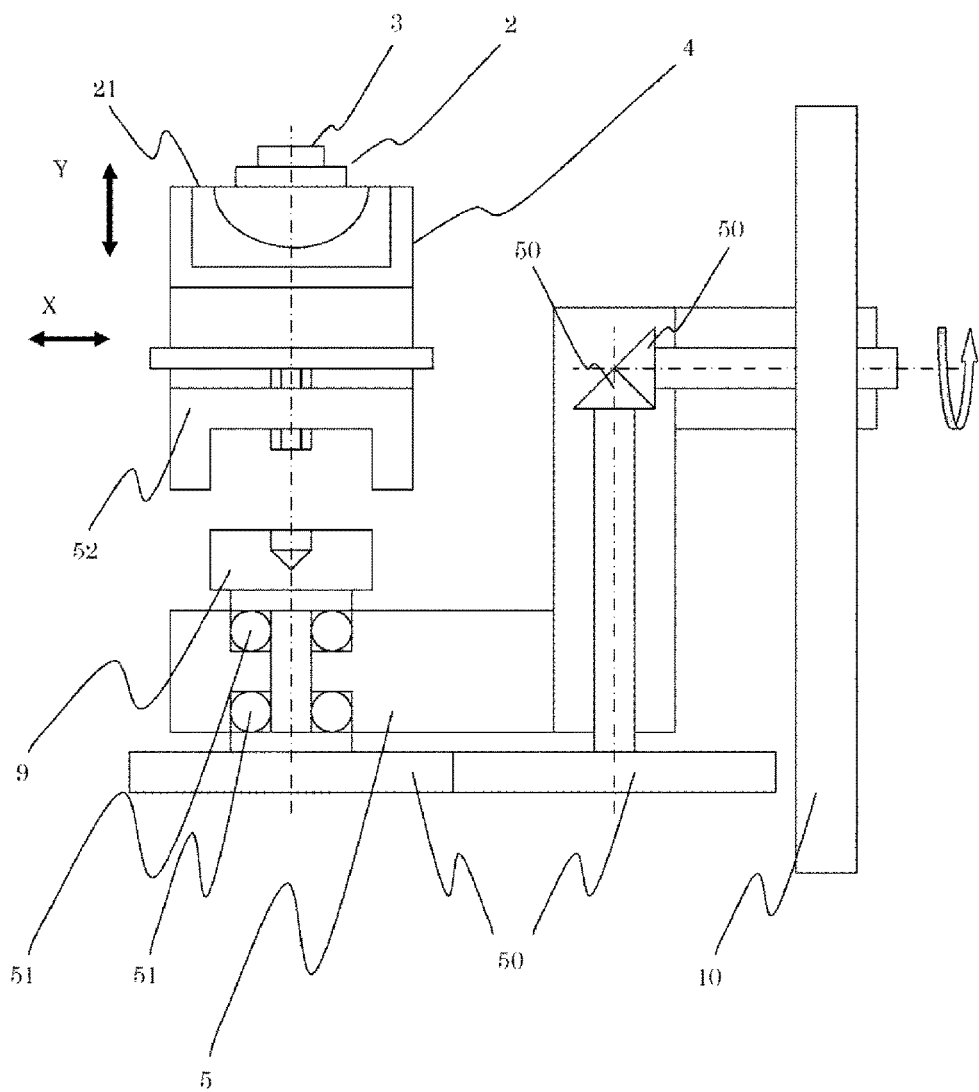

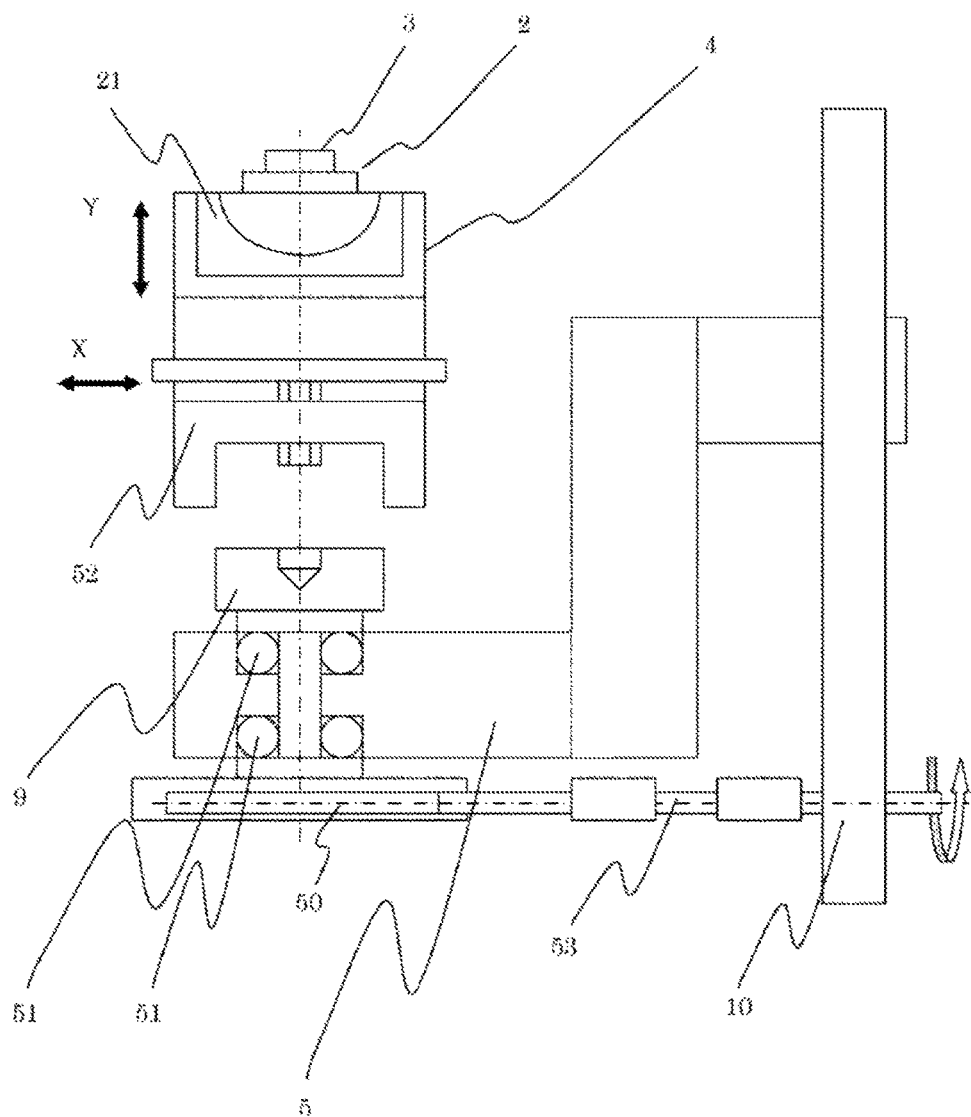
[FIG. 4]

[FIG. 5]
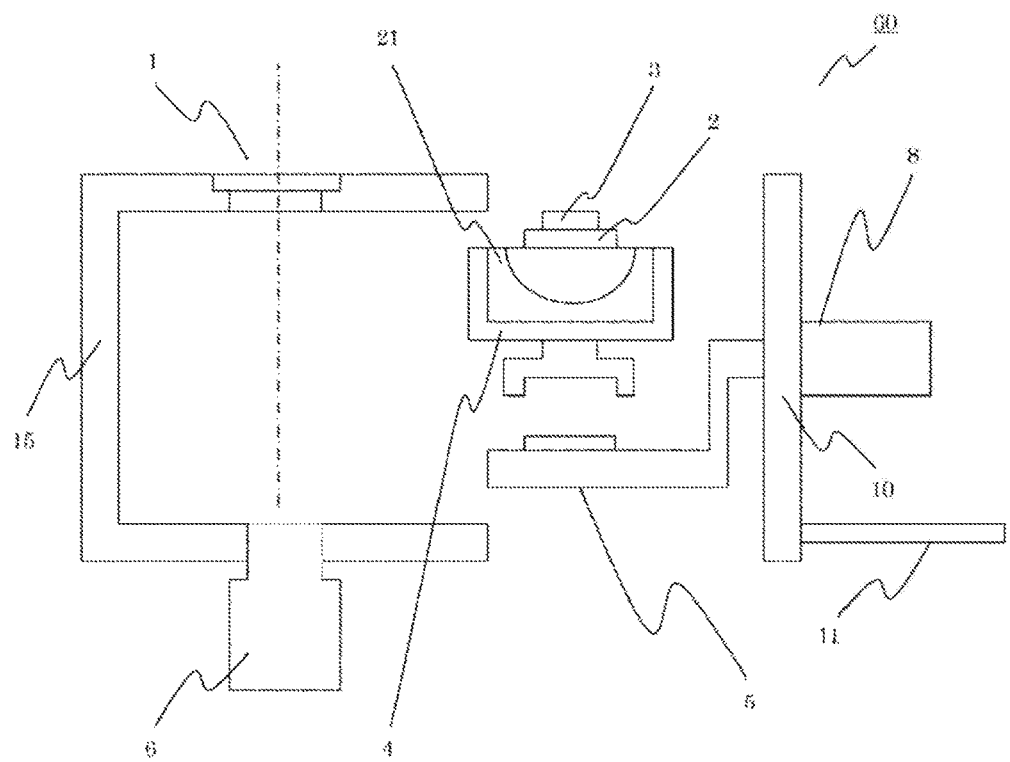
[FIG. 6]
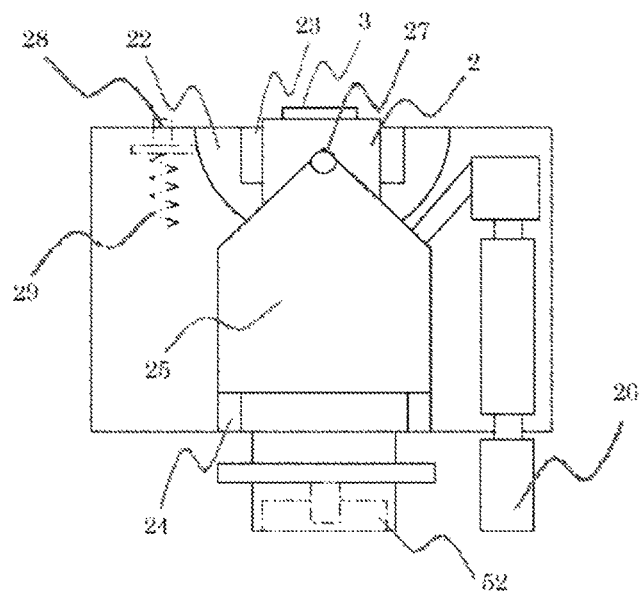

[FIG. 7]
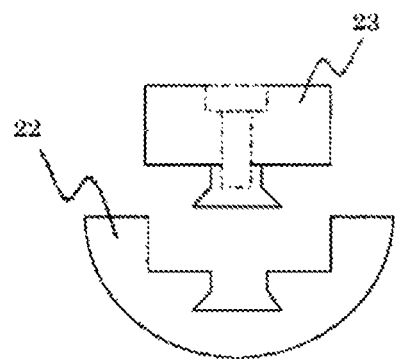
[FIG. 8]
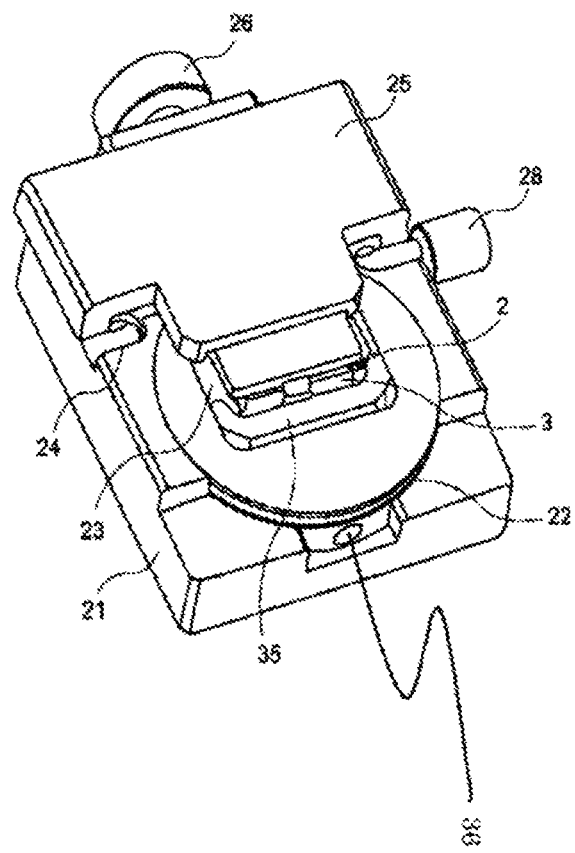

[FIG. 9]
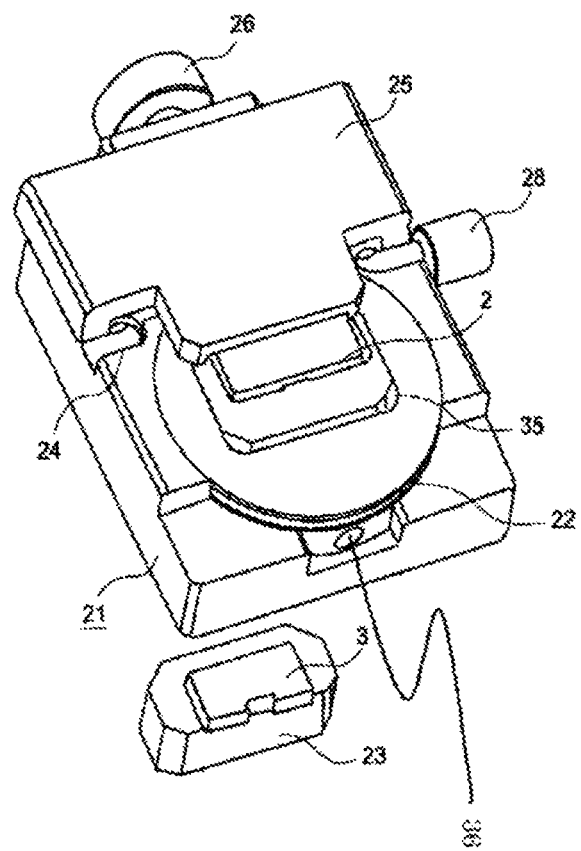

[FIG. 10]
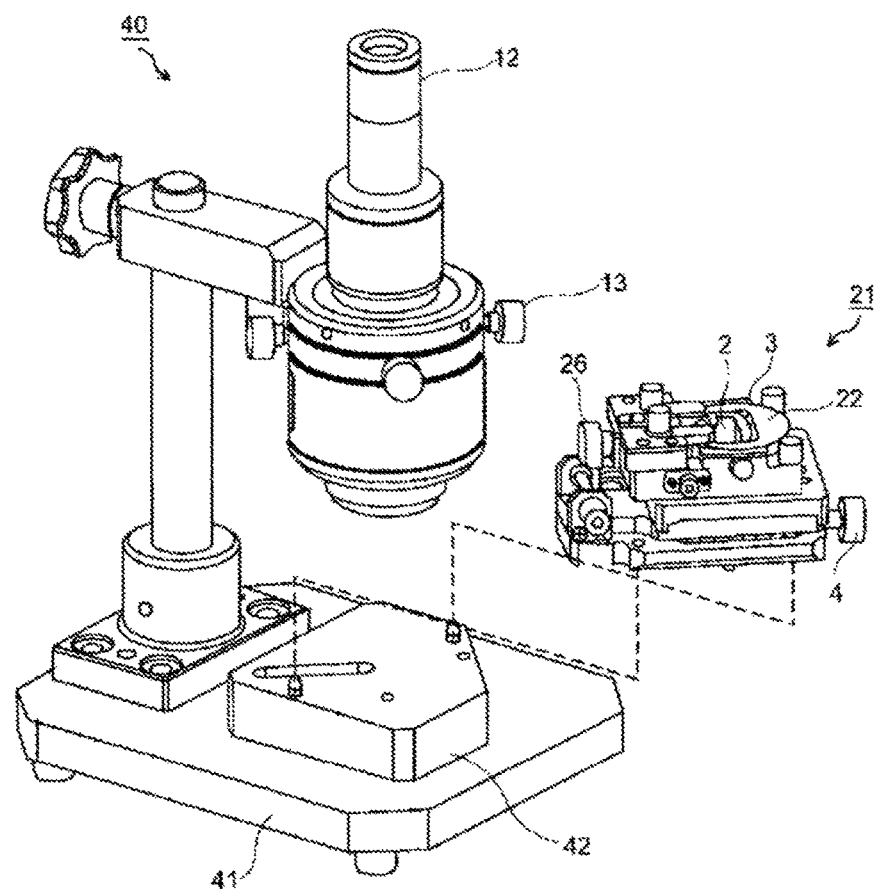

[FIG. 11]
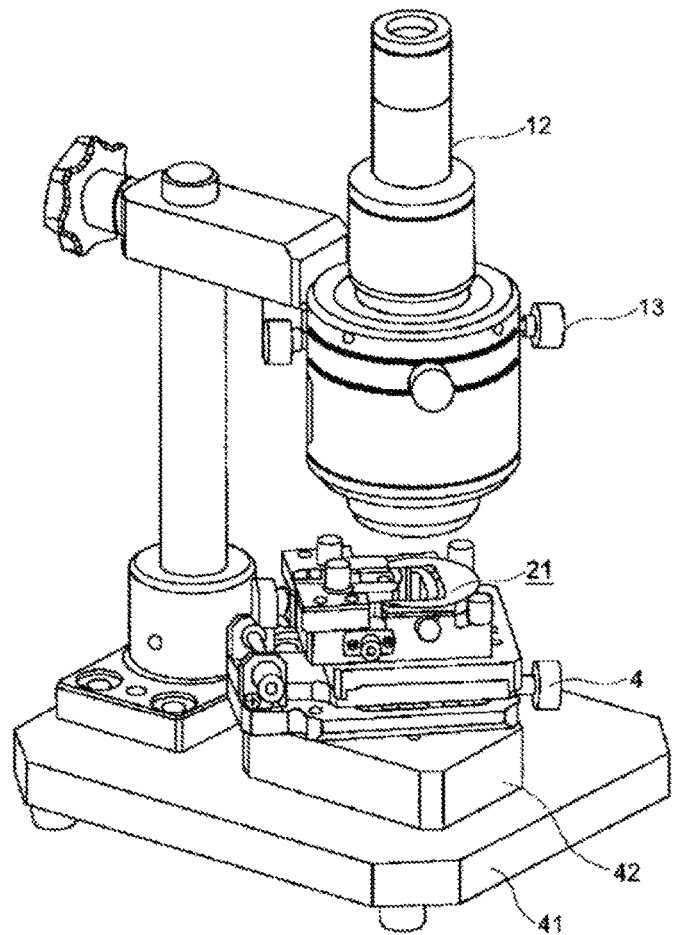
[FIG. 12]
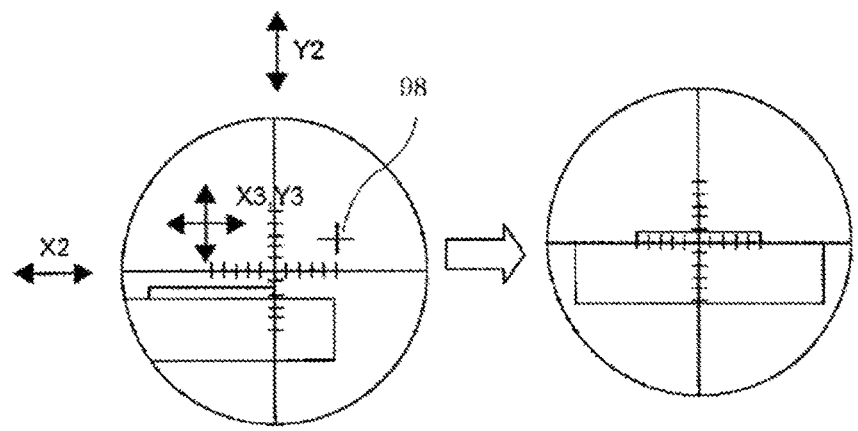

[FIG. 13]
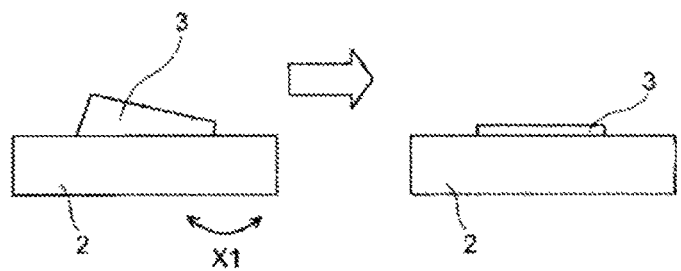
[FIG. 14]
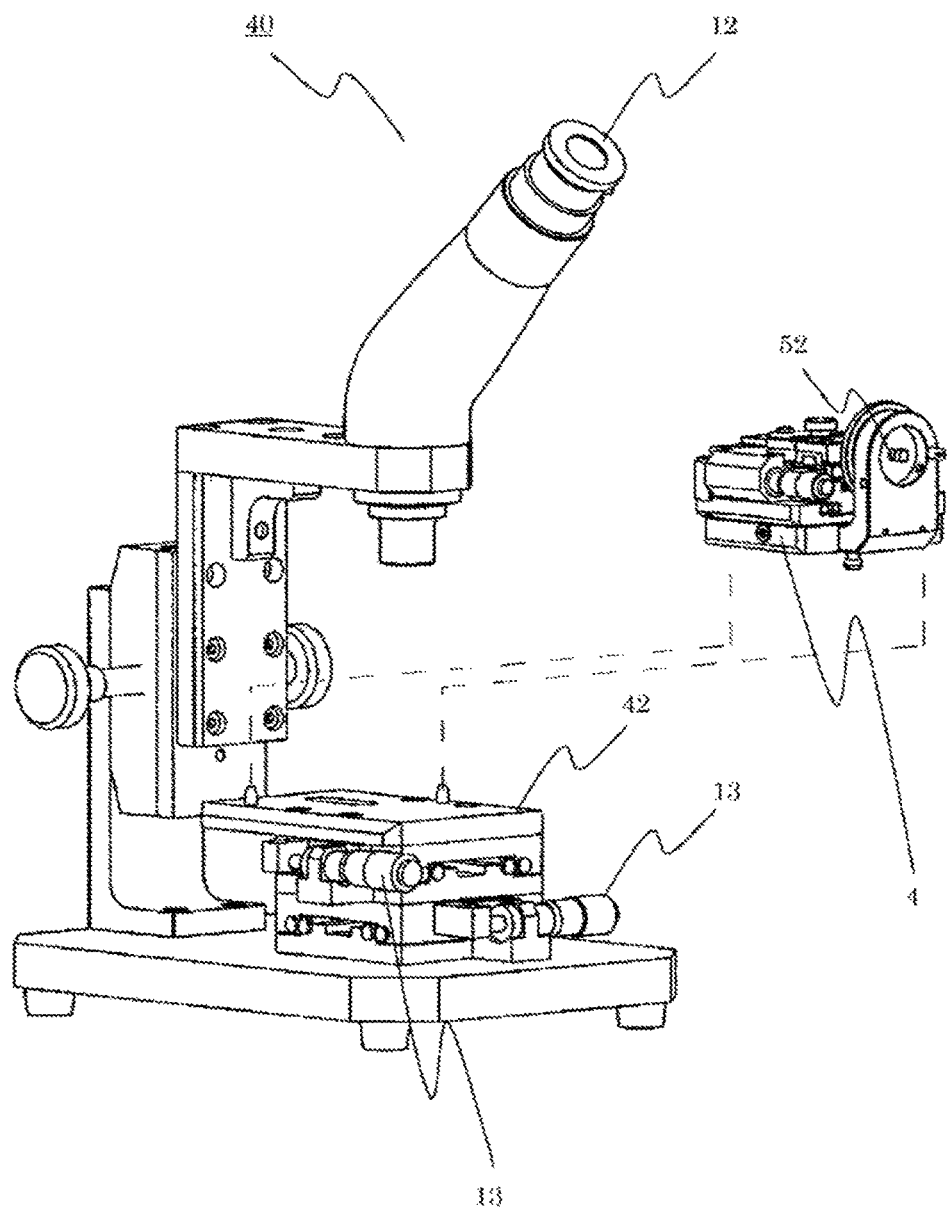

[FIG. 15]
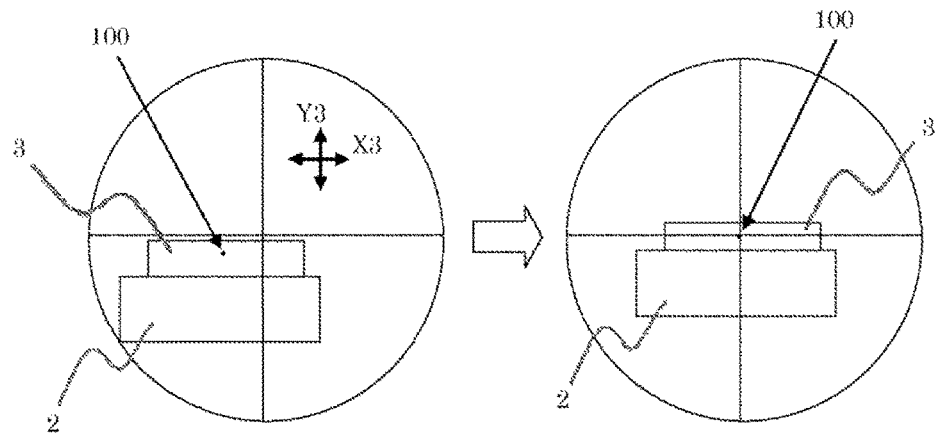
[FIG. 16]
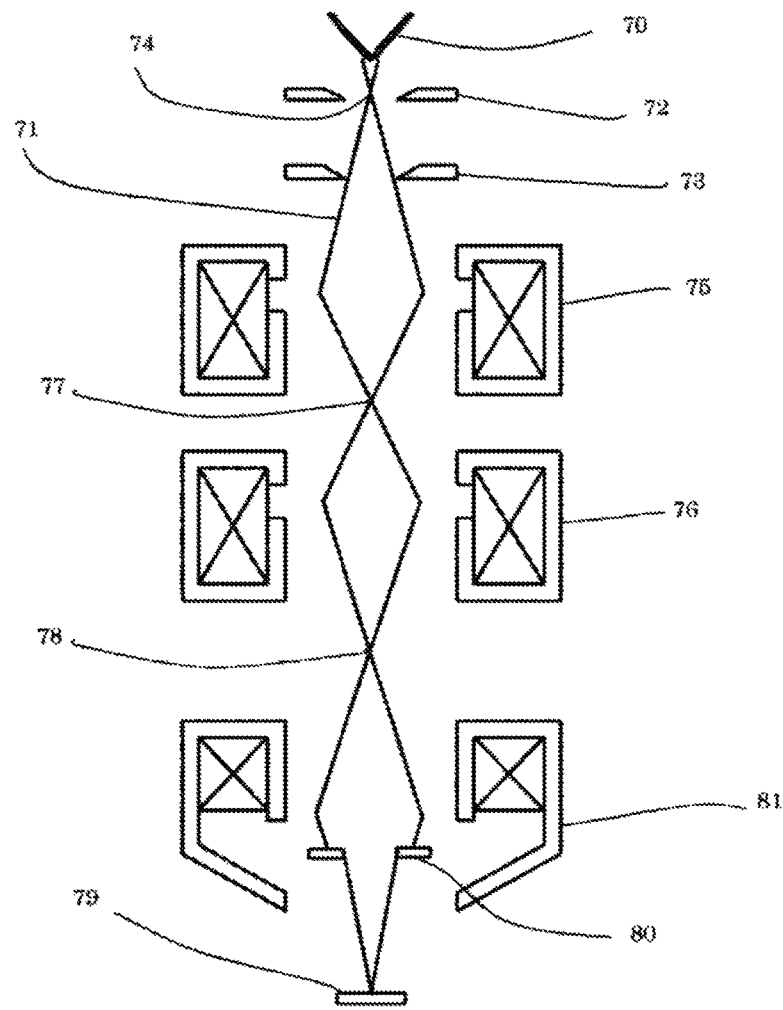

[FIG. 17]
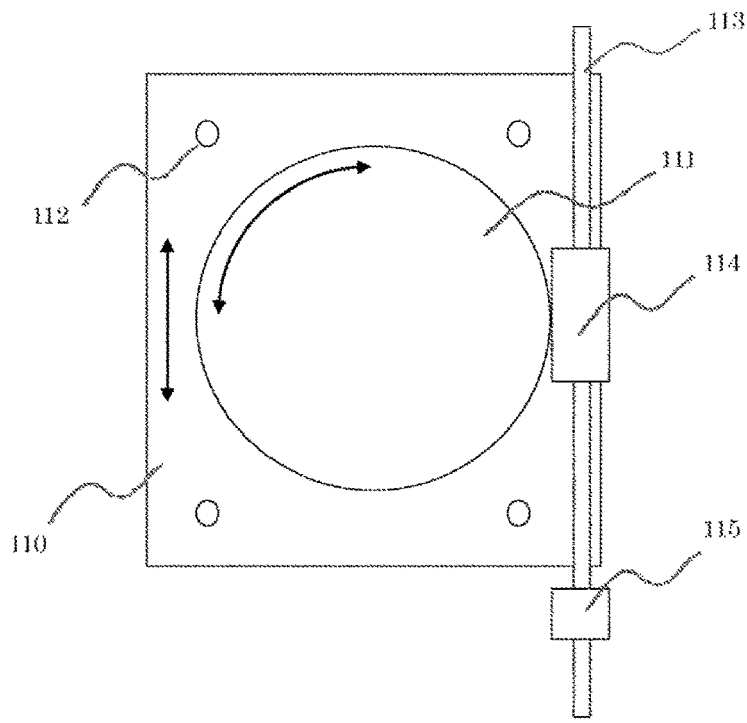
[FIG. 18]
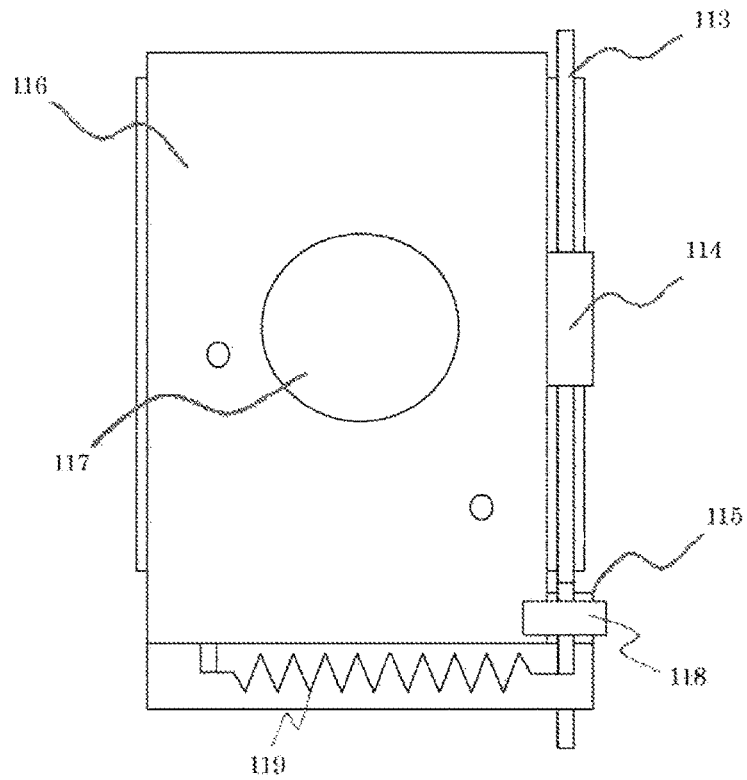

[FIG. 19]
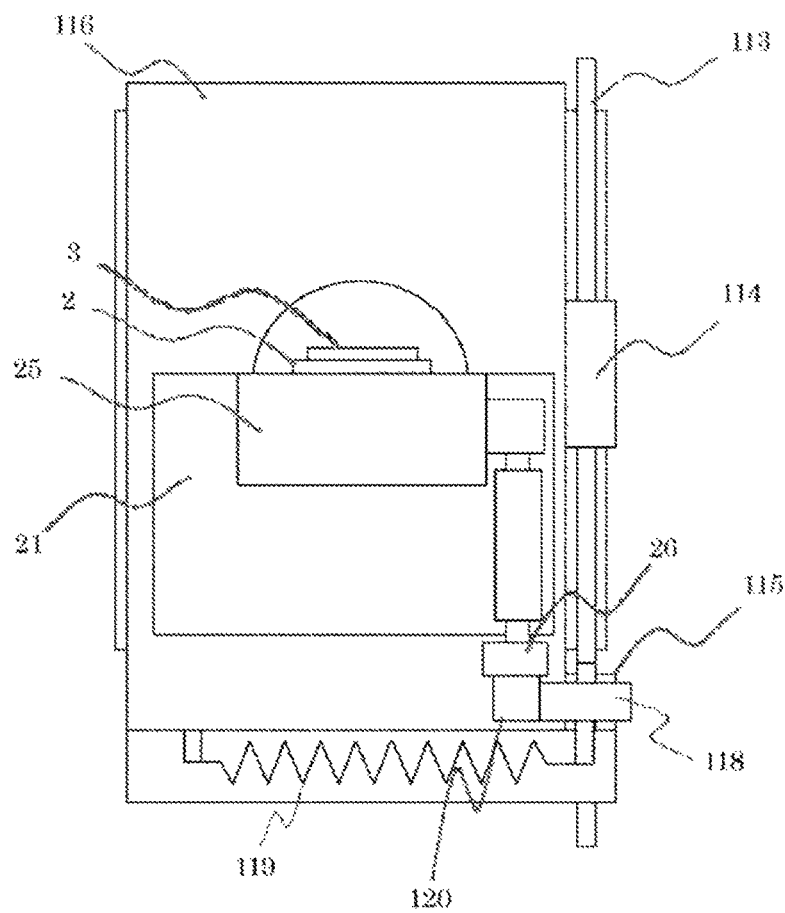
[FIG. 20]
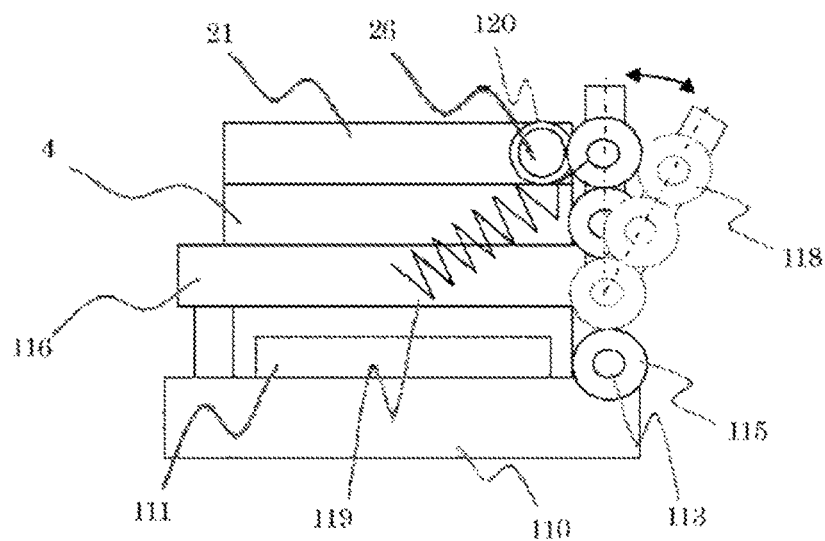

[FIG. 21]
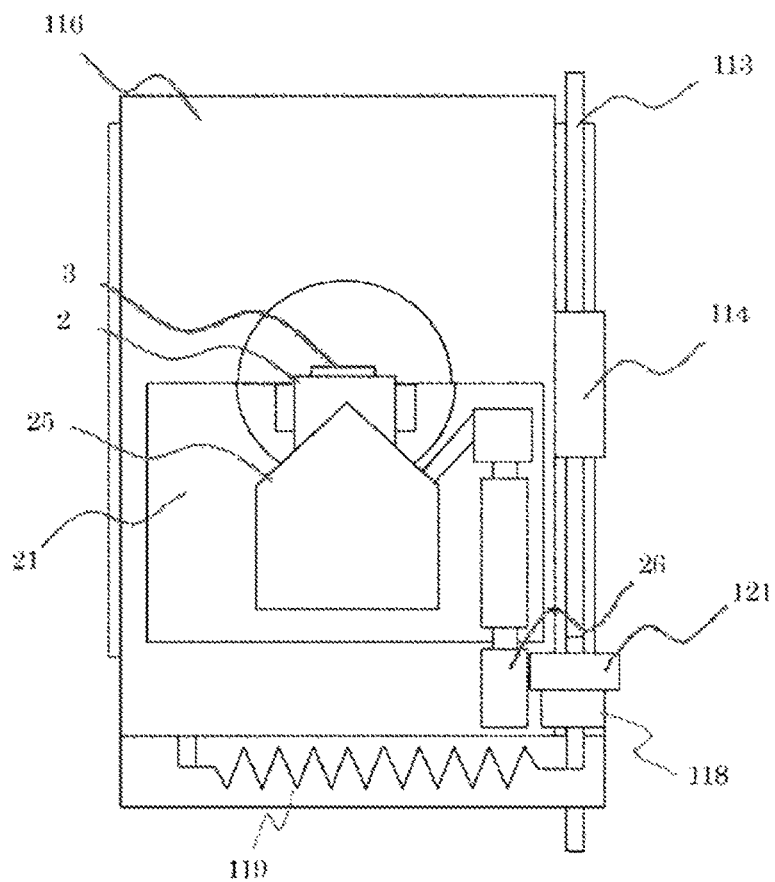
[FIG. 22]
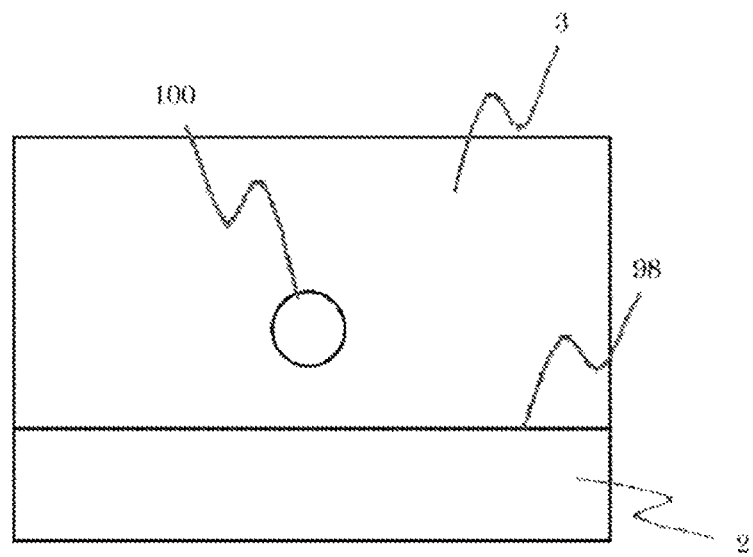

[FIG. 23]
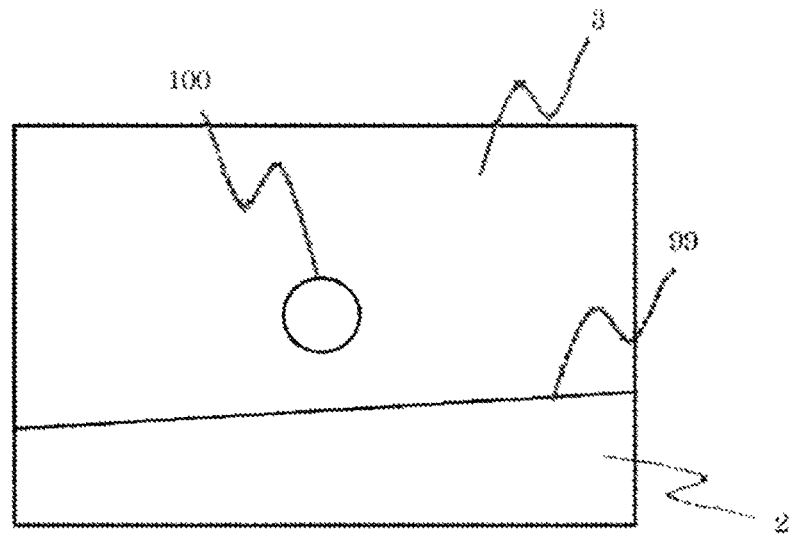
[FIG. 24]
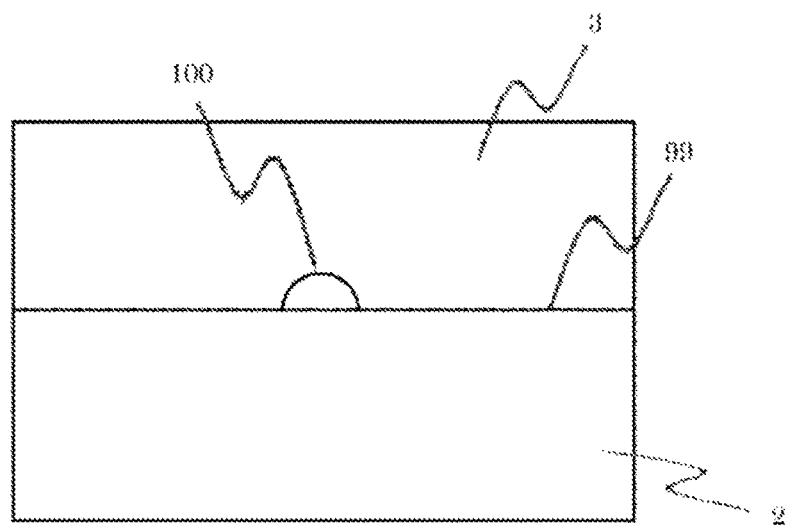
[FIG. 25]
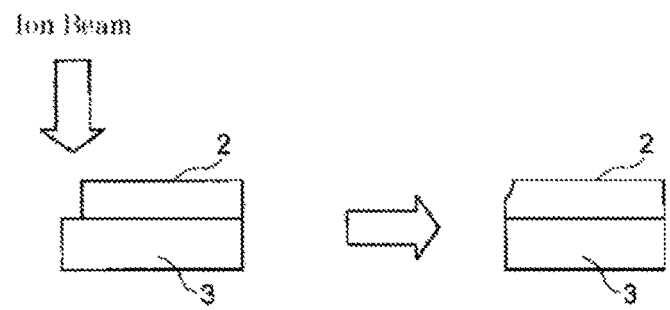

MASK POSITION ADJUSTMENT METHOD OF ION MILLING, ELECTRON MICROSCOPE CAPABLE OF ADJUSTING MASK POSITION, MASK ADJUSTMENT DEVICE MOUNTED ON SAMPLE STAGE AND SAMPLE MASK COMPONENT OF ION MILLING DEVICE

TECHNICAL FIELD

The present invention relates to an ion milling device for preparing a sample for observation by a scanning electron microscope (SEM), a transmission electron microscope (TEM) or the like.

BACKGROUND ART

The ion milling device is a device for polishing surfaces or cross sections of metal, glass, ceramic and the like by irradiating these materials with an argon ion beam or the like, which is suitable as a pretreatment device for observing surfaces and cross sections of samples by the electron microscope such as SEM or TEM.

In the observation of cross sections of samples by the electron microscope in related art, after a portion near a portion to be observed is cut by using, for example, a diamond cutter or a jig saw, a cut surface is mechanically polished and placed on a sample stage for the electron microscope to observe an image.

In the mechanical polishing, there are problems that the surface to be observed is crashed or a deep scratch remains due to abrasive particles in soft samples such as polymeric materials or aluminum. There is also a problem that polishing is difficult in hard samples such as glass and ceramic. Moreover, there is a problem that processing of cross sections is extremely difficult in composite materials formed by stacking a soft material and a hard material.

In response to the above, the ion milling device can perform processing without crashing the surface state even in soft materials and can perform polishing of hard materials and composite materials, therefore, there is an advantage that it is possible to obtain cross sections in a mirror state easily.

As one of methods of preparing samples in such ion milling device, there is a method called cross-section milling.

In the cross-section milling, part of the ion beam is blocked by a mask (shielding plate) arranged above the sample and a cross section of the sample is sputtered along a ridge line (end surface) of the mask, and a cross section of the sample extending along the ridge line of the mask can be obtained.

It is necessary to align a position of the ridge line of the mask with a processing target position of the sample before radiation of the ion beam for performing the cross-section milling. In International Publication WO2012/060416 (Patent Literature 1), a case in which adjustment of the mask position with respect to the sample is performed by an optical microscope is disclosed.

Moreover, in JP-A-2011-249246 (Patent Literature 2), a case in which a motor, a battery and an infrared sensor are provided in a mask position adjustment mechanism, and the mask position adjustment mechanism arranged in an electron microscope is operated through an infrared lamp provided in a sample chamber is disclosed.

CITATION LIST

Patent Literature

Patent Literature 1: WO2012/060416
Patent Literature 2: JP-A-2011-249246

SUMMARY OF INVENTION

Technical Problem

As a result of intensive studies by the present inventors concerning the mask position adjustment for cross-section milling with high accuracy with a simple structure, the following knowledge have been obtained.

As the size of a processing object required for the cross-section milling is reducing, the mask position adjustment using the optical microscope described in Patent Literature 1 is becoming difficult.

It is desirable to use the electron microscope having a higher resolution than the optical microscope for mask adjustment, however, a supply means for the battery is not provided in the electron microscope in the device described in Patent Literature 2, a charging operation is additionally required. Even when solar cells generating power by infrared rays are provided and the battery is charged by irradiation of infrared rays, a large amount of infrared rays is necessary for charging the battery so as to control the motor, which causes a problem of heat generation.

An object of the present invention is to adjust a mask position with high accuracy while performing observation by the electron microscope without providing a heat source in the electron microscope.

Solution to Problem

The present invention relates to the adjustment of the mask position by driving an R-axis of an electron microscope.

Advantageous Effects of Invention

An R-axis originally exists in a sample chamber of the electron microscope, which enables control with high accuracy. The R-axis driving of a sample stage can be substituted by raster rotation, therefore, the mask position can be adjusted with high accuracy while performing observation by the electron microscope according to the present invention.

BRIEF DESCRIPTION OF DRAWINGS

FIG. 1 is a side schematic view of an ion milling device capable of performing both cross-section milling processing and flat milling processing.

FIG. 2 is a top schematic view of the ion milling device capable of performing both cross-section milling processing and flat milling processing.

FIG. 3 is a view showing a structure for rotating and tilting a rotation body 9 and a structure of a sample stage drawing mechanism.

FIG. 4 is a view showing a structure for rotating and tilting a rotation body 9 and a structure of a sample stage drawing mechanism according to a modification example.

FIG. 5 is a structure view of a sample stage drawing mechanism 60.

FIG. 6 is a structure view showing a main body of a sample mask unit 21.

FIG. 7 is a structure view showing a sample holder 23 and a sample holder rotation ring 22.

FIG. 8 is a structure view of the sample mask unit 21 according to a modification example.

FIG. 9 is a structure view of the sample mask unit 21 according to a modification example.

FIG. 10 is an explanatory view showing a state before a sample mask unit micromotion mechanism 4 placed in the sample mask unit 21 is fixed onto a fixed stage 42 or a state after the sample mask unit micromotion mechanism 4 is removed from the fixed stage 42.

FIG. 11 is an explanatory view showing a state where the sample mask unit micromotion mechanism 4 is fixed onto the fixed stage 42.

FIG. 12 is an explanatory view of a method for aligning a portion of a cross section of a sample 3 desired to be polished with an ion beam center 98.

FIG. 13 is an explanatory view of a method for allowing the cross section of the sample 3 to be parallel to the mask 2.

FIG. 14 is an explanatory view of a modification example of the method for installing the sample mask unit micromotion mechanism 4 to an optical microscope 40.

FIG. 15 is an explanatory view of an adjustment method using the optical microscope before fine adjustment by an electron microscope FIG. 16 is a principle-explanatory view of the electron microscope.

FIG. 17 is a top schematic view of a sample stage of the electron microscope.

FIG. 18 is a top schematic view of a mask adjustment unit base 116 installed on the sample stage.

FIG. 19 is a top schematic view of the sample mask micromotion mechanism 4 mounted on the mask adjustment unit base 116 (sample stage).

FIG. 20 is a side schematic view of the sample mask micromotion mechanism 4 mounted on the mask adjustment unit base 116 (sample stage).

FIG. 21 is a top schematic view of a modification example of the sample mask micromotion mechanism 4 mounted on the mask adjustment unit base 116 (sample stage).

FIG. 22 is an observation view by the electron microscope (before fine adjustment).

FIG. 23 is an observation view by the electron microscope (a state where the ridge line is tilted).

FIG. 24 is an observation view by the electron microscope (after fine adjustment).

FIG. 25 is an explanatory view of a method (cross-section milling processing) for preparing an observation cross section in the sample 3 (a processing object 100) by an ion beam device.

DESCRIPTION OF EMBODIMENTS

An embodiment discloses a mask position adjustment method of ion milling including the steps of setting a sample mask component capable of adjusting a positional relationship between a sample and a mask on a sample stage of an electron microscope, connecting a mask position adjustment unit of the sample mask component to an R-axis of the sample stage so as to adjust the position of the mask by driving the R-axis and driving the R-axis while performing observation by the electron microscope to adjust the position of the mask.

The embodiment also discloses that the mask may be moved along a linear guide by rotation of the mask position adjustment unit.

The embodiment also discloses that the mask position adjustment unit and the R-axis may be connected through a rotation member, and the driving of the R-axis may be transmitted to the mask position adjustment unit by rotation of the rotation member.

The embodiment also discloses that the sample mask component may be installed in a moving mechanism rotatably holding an R-mechanism in the sample stage.

The embodiment also discloses that an observation screen of the electron microscope may be adjusted by driving the sample stage in X-axis, Y-axis, Z-axis and T-axis as well as raster rotation to thereby adjust the position of the mask.

An embodiment discloses an electron microscope capable of adjusting a mask position of an ion milling device including a sample stage in which a sample mask component capable of adjusting a positional relationship between a sample and a mask is set, in which an R-axis of the sample stage is connected to a mask position adjustment unit of the sample mask component set on the sample stage, and the position of the mask may be adjusted by driving the R-axis.

The embodiment also discloses the electron microscope in which a mask position adjustment member which moves the mask along a linear guide may be moved by driving the R-axis.

The embodiment also discloses the electron microscope in which the sample stage may include a rotation member connecting the mask position adjustment unit to the R-axis, and the driving of the R-axis may be transmitted to the mask position adjustment unit by rotation of the rotation member.

The embodiment also discloses the electron microscope in which the sample mask component may be installed in a moving mechanism rotatably holding an R-mechanism in the sample stage.

The embodiment also discloses the electron microscope in which an observation screen of the electron microscope may be adjusted by driving the sample stage in X-axis, Y-axis, Z-axis and T-axis as well as raster rotation of the electron microscope while adjusting the mask position by driving the R-axis.

An embodiment discloses a mask adjustment device of ion milling which is set on a sample stage of an electron microscope including a sample mask component capable of adjusting a positional relationship between a sample and a mask, in which a mask position adjustment unit of the sample mask component set in the mask adjustment device is connected to an R-axis of the sample stage, and the position of the mask is adjusted by driving the R-axis.

The embodiment also discloses the mask adjustment device in which a mask position adjustment component member which moves the mask along a linear guide may be moved by driving the R-axis.

The embodiment also discloses the mask adjustment device further including a rotation member connecting the mask position adjustment unit to the R-axis, in which the driving of the R-axis may be transmitted to the mask position adjustment unit by rotation of the rotation member.

The embodiment also discloses that the mask adjustment device may be installed in a moving mechanism rotatably holding an R-mechanism in the sample stage.

The embodiment also discloses the mask adjustment device in which the sample stage may be driven in X-axis, Y-axis, Z-axis and T-axis while adjusting the mask position by driving the R-axis to thereby move the mask.

An embodiment discloses a sample mask component of an ion milling device capable of adjusting a positional relationship between a sample and a mask, in which a mask position adjustment unit adjusting the positional relationship between the sample and the mask may be connected to an R-axis of the sample stage when set on a sample stage of an electron microscope, and the position of the mask is adjusted by driving the R-axis.

The embodiment also discloses the sample mask component in which the mask may be moved along a linear guide by rotation of the mask position adjustment unit.

The embodiment also discloses the sample mask component in which the mask position adjustment unit may be connected to an R-axis through a rotation member, and the driving of the R-axis may be transmitted by rotation of the rotation member.

The embodiment also discloses the sample mask component which may be installed in a moving mechanism rotatably holding an R-mechanism in the sample stage.

The embodiment also discloses the sample mask component in which the sample stage may be driven in X-axis, Y-axis, Z-axis and T-axis while adjusting the mask position by driving the R-axis to thereby move the mask.

Hereinafter, the above and other novel characteristics and advantages of the present invention will be explained with reference to the drawings. The drawings are used for comprehension of the invention and do not intend to limit the scope of rights.

EMBODIMENT

In the present embodiment, an example of an ion milling device capable of selectively performing both cross-section milling processing and flat milling processing by using an argon ion beam will be explained.

FIG. 1 is aside schematic view of an ion milling device capable of performing both cross-section milling processing and flat milling processing, and FIG. 2 is a top schematic view of FIG. 1. The ion milling device according to the embodiment is provided with a processing observation window 7 on an upper surface of a vacuum chamber 15, a sample stage 8 in a front surface and an ion source 1 in a left surface, and a shutter 101 is provided between a sample 3 and the processing observation window 7. The shutter 101 is installed for preventing accumulation of sputtered particles on the processing observation window 7. The vacuum chamber 15 has a box shape which forms a space for forming a vacuum atmosphere, however, it may have equivalent shapes. The processing observation window 7 is provided in an upper part of the vacuum chamber 15 (a direction opposite to a direction in which a gravitational field is directed in an environment with a gravity). The ion source 1 is provided on the side wall surface of the vacuum chamber 15 (a surface adjacent to the upper direction of the vacuum chamber 15 in a direction vertical to the direction in which the gravitational field is directed). That is, the processing observation window 7 is provided on a wall surface of the vacuum chamber 15 in a direction orthogonal to a tilt axis of the sample stage 8 and a flat surface including an irradiation orbit of the ion beam emitted from the ion source 1. The ion beam emitted from the ion source is not limited to the argon ion beam, and a krypton ion beam, a xenon ion beam, a gallium ion beam and so on may be used. On an opening for the processing observation window 7, not only the window which can be vacuum sealed is provided but also an optical microscope or an electron microscope may be installed.

FIG. 3 is a view showing a structure for rotating and tilting a rotation body 9 and a structure of a sample stage drawing mechanism.

In a sample unit base 5, the rotation body 9 on which a sample holding member (member for holding a sample including a sample mask unit micromotion mechanism 4) can be placed is provided, and the rotation body 9 functions as a support stage which supports the sample holding member. The sample unit base 5 includes plural gears 50 transmitting a rotational force from the outside of a flange 10 to the rotation body 9 and plural bearings 51 rotatably supporting the rotation body 9 in addition to the rotation body 9. The sample mask unit micromotion mechanism 4 is provided with a mask unit fixing portion 52 (including a screw) on the bottom thereof. The sample mask unit micromotion mechanism 4 is mounted on the sample unit base 5 by allowing the bottom thereof to contact on an upper surface of the rotation body 9 of the sample unit base 5 to be fixed to the rotation body 9 by a screw through the mask unit fixing portion 52. The rotation body 9 mounted on the sample unit base 5 is configured so as to rotate and tilt at an arbitrary angle with respect to an optical axis of the ion beam emitted by the ion source 1 from a side direction of the vacuum chamber 15, and a rotation and tilt direction and an tilt angle are controlled by the sample stage 8.

FIG. 4 is a view showing a structure for rotating and tilting the rotation body 9 and a structure of a sample stage drawing mechanism according to a modification example. As methods for rotating and tilting the rotation body 9 of the sample unit base 5, a method of rotating a rotation shaft (rotation shaft which has the same axis as an axis of the sample stage 8) arranged inside the sample unit base 5 by forming the plural gears 50 and axes in the sample unit base 5 as shown in FIG. 3 and a method of rotating a rotation shaft (rotation shaft having a different axis from the axis of the sample stage 8) provided in the flange 10 by providing a shaft coupling 53 connecting to the gears 50 of the sample unit base 5 as shown in FIG. 4 may be used.

The sample 3 placed on the sample mask unit micromotion mechanism 4 can be set at a predetermined angle with respect to the optical axis of the ion beam by rotating and tilting the rotation body 9 of the sample unit base 5. Moreover, the rotation shaft of the rotation body 9 of the sample unit base 5 is allowed to match the position of a sample upper surface (lower surface of the mask), thereby preparing an efficient smooth processing surface. The sample mask unit micromotion mechanism 4 is also configured so as to move to front, back, right and left in a vertical direction with respect to the optical axis of the ion beam, that is, in X-direction and Y-direction of FIG. 3 and FIG. 4.

The sample unit base 5 is arranged through the sample stage 8 (rotation mechanism) mounted on the flange 10 doubling as part of a container wall of the vacuum chamber 15. When the flange 10 is drawn along a linear guide 11 to release the vacuum chamber 15 to an atmospheric state, the sample unit base 5 is drawn to the outside of the vacuum chamber 15. The sample stage drawing mechanism is formed in this manner.

FIG. 5 is a structure view of a sample stage drawing mechanism 60. The sample stage drawing mechanism 60 includes the linear guide 11 and the flange 10 fixed to the linear guide 11. The sample unit base 5 fixed to the sample stage 8 mounted on the flange 10 is drawn from the vacuum chamber 15 along the linear guide 11 by drawing the flange 10 along the linear guide 11. With this operation, the sample mask unit micromotion mechanism 4 mounted on the sample unit base 5, a sample mask unit 21 placed in the sample mask unit micromotion mechanism 4, a mask 2 placed on the sample mask unit 21, a sample holder 23 installed in the mask 2, and the sample 3 placed on the sample holder 23 are integrally drawn from the vacuum chamber 15.

In the embodiment, the sample mask unit micromotion mechanism 4 in which the sample mask unit 21 is placed has a structure fixed to the sample unit base 5 so as to be attachable/detachable. Therefore, when the sample mask unit micromotion mechanism 4 in which the sample mask unit 21 is placed is drawn to the outside of the vacuum chamber 15, the sample mask unit micromotion mechanism 4 is allowed to be attached/detached with respect to the sample unit base 5 (attachment/detachment standby of the sample mask unit 21).

FIG. 5 shows a state where the sample mask unit micromotion mechanism 4 in which the sample mask unit 21 is placed is detached from the sample unit base 5 in the outside of the vacuum chamber 15 from the attachable/detachable state. The attachment/detachment is performed by manual or by using suitable instruments.

FIG. 6 is a structure view showing a main body of the sample mask unit 21. In the embodiment, a unit in which at least the sample holder 23, a rotation mechanism thereof, the mask 2 and a fine adjustment mechanism thereof are integrally formed is referred to as the sample mask unit 21 (main body) in the embodiment. The sample holder 23 includes a sample holder rotation ring 22 and a sample holder turning screw 28 as a rotation mechanism, which can rotate vertically with respect to the optical axis of the ion beam. The sample holder rotation ring 22 is configured to rotate by turning the sample holder turning screw 28, which returns to a position before rotation by being reversely rotated due to a spring pressure of a spring 29 compressed by the rotation.

The sample mask unit 21 has a mechanism allowing attachment/detachment with respect to the sample mask unit micromotion mechanism 4 and a mechanism capable of finely adjusting the position and the rotation angle of the mask 2. Though the example in which the sample mask unit 21 and the sample mask unit micromotion mechanism 4 are two components is explained in the embodiment, it is also preferable to configure these units as one component (in the embodiment, the sample mask unit and the sample mask unit micromotion mechanism are separately explained for making the invention clearly understood).

The mask 2 is fixed to a mask holder 25 by a mask fixing screw 27. The mask holder 25 moves along a linear guide 24 by operating a mask fine adjustment mechanism 26 (mask position adjustment unit), and the mask 2 also moves with the movement, as a result, a relative positional relationship (shielding positional relationship) between the sample 3 and the mask 2 is finely adjusted. A micrometer may be used as the mask fine adjustment mechanism 26.

FIG. 7 is a structure view showing the sample holder 23 and the sample holder rotation ring 22. An outer portion of the sample holder rotation ring 22 has an arc shape, and the inside thereof has a shape which can be fitted to the sample holder 23. The sample holder 23 is inserted to the sample holder rotation ring 22 from a lower side opposite to an upper side to which the sample is fixed, and is fixed to the sample holder rotation ring 22 by a screw. The sample 3 adhered and fixed to the sample holder 23 is closely contacted and fixed to the mask 2 after the relative position between the sample 3 and the mask 2 is finely adjusted.

FIG. 8 and FIG. 9 are structure views of the sample mask unit 21 according to modification examples. FIG. 8 shows a state in which the sample holder 23 to which the sample 3 is fixed is mounted in the sample mask unit 21 and FIG. 9 shows a state in which the sample holder 23 to which the sample 3 is fixed is removed from the sample mask unit 21. The sample holder 23 to which the sample 3 is adhered and fixed can be mounted in the sample mask unit 21 by allowing the sample 3 to contact the mask 2 through a hole provided in the sample holder rotation ring 22 from a back surface of the sample mask unit 21. The sample holder 23 to which the sample is adhered and fixed is fixed by a sample holder fixing metal fitting 35. The fixing is performed by inserting a hexagonal wrench or the like into the sample holder fixing mechanism 36 and rotating the wrench and moving the sample holder metal fitting 35. The mask fine adjustment mechanism 26 can finely adjust a relative position between the mask 2 fixed to the mask holder 25 and the sample 3 adhered and fixed to the sample holder 23 by performing fine adjustment of the position of the mask holder 25.

FIG. 10 is an explanatory view showing a state before the sample mask unit micromotion mechanism 4 placed in the sample mask unit 21 is fixed onto a fixed stage 42 or a state after the sample mask unit micromotion mechanism 4 is removed from the fixed stage 42. FIG. 11 is an explanatory view showing a state where the sample mask unit micromotion mechanism 4 is fixed onto the fixed stage 42. An outline of a method for positioning the mask will be explained below.

At the time of adjusting the positional relationship of shielding between the mask 2 and the sample 3, the sample mask unit micromotion mechanism 4 in which the sample mask unit 21 is placed is removed from the sample unit base 5 (FIG. 10) and mounted on the fixed stage 42 of an optical microscope (FIG. 11) to thereby adjust the positional relationship of shielding of the mask 2 with respect to the sample 3.

Here, the optical microscope 40 for observing the positional relationship of shielding between the mask 2 and the sample 3 is configured separately from the vacuum chamber 15 as shown in FIG. 10 and can be arranged at an arbitrary place. The optical microscope 40 includes a well-known loupe 12, a loupe micromotion mechanism 13, an observation stage 41 and the fixed stage 42 for installing the removed sample mask unit micromotion mechanism 4 in which the sample mask unit 21 is placed on the observation stage 41. The fixed stage 42 has shafts and holes for positioning. Then, the sample mask unit micromotion mechanism 4 in which the sample mask unit 21 is placed is installed at a determined position on the fixed stage 42 with reproducibility due to the shafts and holes for positioning.

FIG. 12 is an explanatory view of a method for aligning a portion of a cross section of the sample 3 desired to be polished with an ion beam center 98. A photosensitive paper or the like is attached to the sample holder 23, and a mark formed by irradiation of the ion beam (namely, a beam center) is aligned with the center of the loupe by moving X2 and Y2 directions in FIG. 12 by driving the loupe micromotion mechanism 13. The sample mask unit micromotion mechanism 4 in which the sample mask unit 21 is placed after the sample 3 is placed as shown in FIG. 6 and the like is installed on the fixed stage 42 as shown in FIG. 11. In the sample mask unit micromotion mechanism 4 installed on the fixed stage 42, the ion beam center 98 can be aligned with the portion (hereinafter, a processing object) of the cross section desired to be polished by adjusting the position in X3 and Y3 directions to align the ion beam center 98 with the center of the loupe.

FIG. 13 is an explanatory view of a method for allowing the cross section of the sample 3 to be parallel to the mask 2. Positional adjustment in the X1 direction of FIG. 13 is performed by turning the sample holder turning screw 28 so that the cross section of the sample 3 is parallel to the ridge line of the mask 2. Setting is performed so that the center of the processing object is aligned with the ridge line of the mask 2 by turning the mask fine adjustment mechanism 26 (At this time, when the cross section of the sample 3 is desired to be obtained without the processing object, setting is performed so that the sample 3 slightly protrudes from the mask 2, for example, so that the sample 3 protrudes from the mask 2 by about 50 µm by turning the mask fine adjustment mechanism 26).

As described above, at the time of adjusting the positional relationship of shielding between the mask 2 and the sample 3, the sample mask unit micromotion mechanism 4 in which the sample mask unit 21 is placed is removed from the sample unit base 5 and attached to the fixed stage 42 of the optical microscope 40, and the shielding positional relationship of the mask 2 with respect to the sample 3 is adjusted by the mask position adjustment unit (the mask fine adjustment mechanism 26).

FIG. 14 is an explanatory view of a modification example of the method for installing the sample mask unit micromotion mechanism 4 to the optical microscope 40. The installation to the optical microscope 40 may also be performed by a method of using a lower surface of the sample mask unit micromotion mechanism 4 without using the sample mask unit 21 or the mask unit fixing portion 52 of the sample mask unit micromotion mechanism 4 with respect to the sample unit base 5.

The example differs from the example shown in FIG. 10 to FIG. 13 in a point that alignment performed by the loupe micromotion mechanism 13 for aligning the beam center with the loupe center is performed on the fixed stage 42 side, and other operations are performed in the same manner.

It is difficult to align the ridge line of the mask 2 with the center of the processing object of several µm or less in the adjustment of the positional relationship of shielding by the optical microscope 40. Accordingly, fine adjustment of positional relationship between the sample 3 and the mask 2 by using an electron microscope (it is also preferable to perform adjustment by using only the electron microscope from the beginning without performing adjustment of the positional relationship of shielding by the optical microscope 40).

First, explanation will be made from the state where the sample mask unit micromotion mechanism 4 in which the sample mask unit 21 is placed is removed from the sample unit base 5 and attached to the fixed stage 42 of the optical microscope 40.

FIG. 15 is an explanatory view of an adjustment method using the optical microscope before fine adjustment by the electron microscope. It is in the state where the adjustment between the loupe center and the ion beam center has been completed. First, a position of a processing object 100 of approximately several µm which is seen by the loupe as a point is adjusted in X3 and Y3 directions in FIG. 15 by the sample mask unit micromotion mechanism 4 to be aligned with the loupe center. In order to make the cross section of the sample 3 be parallel to the mask 2 as shown in FIG. 13, positional adjustment in the X1 direction in FIG. 13 is performed by turning the sample holder turning screw 28, thereby performing adjustment so that the cross section of the sample 3 is parallel to the ridge line of the mask 2 (when the processing object is arranged side by side, the ridge line of the mask 2 is aligned with the object). It is desirable that the positional relationship between the processing object 100 and the ridge line of the mask 2 is adjusted to 25 µm or less by turning the mask fine adjustment mechanism 26 (because adjustment will be easily performed by the electron microscope in the following process). After the adjustment in this stage is performed, the sample mask unit micromotion mechanism 4 in which the sample mask unit 21 is placed is removed from the fixed stage 42 of the optical microscope 40 and is mounted on the sample stage of the electron microscope.

FIG. 16 is a principle-explanatory view of the electron microscope. Hereinafter, the principle of the electron microscope will be explained. Though a case of thermal electron sources will be explained, any of a $LaB_6$ electron source, a field emission electron source and a Schottky electron source may be used as the electron source.

A device inside the electron microscope is evacuated, and a high pressure is applied to an electron source 70 when reaching a target vacuum pressure. An electron beam 71 is emitted from the electron source 70 to which the high pressure has been applied. The emitted electron beam 71 receives a focusing action by a potential of a Wehnelt electrode 72, an orbit thereof is bent and a first crossover 74 is made between the Wehnelt electrode 72 and an anode electrode 73. The electron beam 71 accelerated by an accelerating voltage further passes the anode electrode 73 and receives the focusing action by a first focusing lens 75 (an electromagnetic coil type) and a second crossover 77 is made between the first focusing lens 75 and a second focusing lens (the electromagnetic coil type). Furthermore, a third crossover 78 is made between the second focusing lens 76 and an objective lens 81. The electron beam 71 is focused by the objective lens 81 and limited by an objective aperture 80, then, emitted onto the surface of a sample 79 (however, the objective aperture is not always in a true position). The electron beam 71 emitted onto the surface of the sample 79 on the sample stage generates, for example, backscattered electrons reflected on the sample surface and secondary electrons jumped out from the sample surface. These backscattered electrons, the secondary electrons and the like are taken by a detector installed in a sample chamber. Then, a signal from the detector passes through an amplifier circuit and transmitted into a display after being converted into a digital signal to be displayed as an image of the sample surface.

The sample stage of the electron microscope is generally a five-axis (X, Y, Z, T and R) driven stage, which can control three-dimensional positions of front, back, right, left, up and down as well as tilting and rotation. In this case, the sample stage having a structure in which a T-mechanism driving the stage in the T-axis direction is arranged on a Z-mechanism driving the stage in the Z-axis direction, and a Y-mechanism, an X-mechanism and an R-mechanism are similarly arranged in this order will be explained as an example. However, the structure is not limited to this. For example, a structure in which the Z-mechanism is arranged above the T-mechanism, a structure in which the Y-mechanism is arranged above the X-mechanism or a structure of six-axis driving including two T-mechanisms may be adopted.

FIG. 17 is a top schematic view of the sample stage of the electron microscope. An R-mechanism 111 arranged on the highest position of the sample stage of the electron microscope, an X-mechanism 110 arranged under the R-mechanism 111 and so on are shown. Four positioning holes 112 provided in the X-mechanism 110 are for determining positions of a mask adjustment unit base 116 used when the sample mask unit micromotion mechanism 4 is mounted on the electron microscope. The R-mechanism 111 arranged on the X-mechanism 110 so as to rotate (R-axis driving) rotates (R-axis driving) as an R-drive shaft 113 and an R-drive gear 114 rotate. Here, the R-drive shaft 113 of the sample stage according to the embodiment is provided with a mask adjustment gear 115 for driving the mask fine adjustment mechanism 26.

FIG. 18 is a top schematic view of the mask adjustment unit base 116 installed on the sample stage. When performing normal observation, the sample is mounted on the R-mechanism 111 which is the highest mechanism of the sample stage. However, when fine adjustment of the positional relationship between the sample 3 and the mask 2 is performed by using the electronic microscope, the sample mask unit micromotion mechanism 4 in which the sample mask unit 21 is placed is mounted on the mask adjustment unit base 116 installed on the X-mechanism 110 as shown in FIG. 18. As the mask adjustment unit base 116 is provided with a hole for setting 117 which exposes part of the R-mechanism, normal observation can be performed even in the state where the mask adjustment unit base 116 is installed. It is also possible to combine the mask adjustment unit base 116 with the sample stage to be integrally formed.

FIG. 19 is a top schematic view of the sample mask micromotion mechanism 4 mounted on the mask adjustment unit base 116 (sample stage) and FIG. 20 is a side schematic view thereof.

A mask adjustment gear unit 118 in which three gears having the same diameter are aligned in a straight line is provided in the mask adjustment unit base 116. The configuration (the number, the arrangement and the kind) of the gears is determined by a positional relationship between the mask adjustment gear 115 and the mask fine adjustment mechanism 26, therefore, the configuration is not limited to the above and it is also preferable that gears do not have the same diameter. A gear in a lower stage of the mask adjustment gear unit 118 is connected to the mask adjustment gear 115. The mask adjustment gear unit 118 can move the other end in an arc shape around the shaft center of the gear in the lower stage. In the embodiment, when the mask adjustment gear unit 118 is approximately vertical, the gear in an upper stage contacts a mask fine adjustment gear 120 attached to the mask fine adjustment mechanism 26. A positional relationship between the mask adjustment gear unit 118 and the mask fine adjustment gear 120 is not limited to this. The mask adjustment gear unit 118 can move the other end in the arc shape around the shaft center of the gear in the lower stage to a position where the mask adjustment gear unit 118 contacts the mask fine adjustment gear 120. A contact portion of the mask fine adjustment gear 120 and the mask adjustment gear unit 118 are pushed and connected by a restoring force of a compression spring 119 connected to the mask adjustment gear unit 118 and the mask adjustment unit base 116. Accordingly, the mounting of the sample mask unit micromotion mechanism 4 in which the sample mask unit 21 is placed on the electron microscope is completed. The rotation of the R-drive shaft 113 is transmitted to the mask adjustment gear 115, the mask adjustment gear unit 118 and the mask fine adjustment gear 120, which rotates the mask fine adjustment mechanism 26. The position of the mask 2 can be controlled by the rotation of the R-drive shaft 113. The position of the sample micromotion mechanism 4 mounted on the mask adjustment unit base 116 (sample stage) can be controlled by driving of four axes (X, Y, Z and T) other than the R-axis. The position control of the R-axis can be substituted by a raster rotation which rotates a visual field by rotation in a scanning direction of the electron beam.

FIG. 21 is a top schematic view of a modification example of the sample mask micromotion mechanism 4 mounted on the mask adjustment unit base 116 (sample stage). The connection between the mask fine adjustment mechanism 26 and the R-drive shaft is performed as it is without adding the mask fine adjustment gear 120 or the like to the mask fine adjustment mechanism 26, and is performed by allowing a rubber washer 121 provided in the gear in the upper stage of the mask adjustment gear unit 118 to contact the mask fine adjustment mechanism 26. A rotating component having flexibility such as an O-ring may be used instead of the rubber washer 121.

In the case where the positional relationship between the sample 3 and the mask 2 is finely adjusted by using the electron microscope, a portion near the processing object 100 is observed by the electron microscope, and it is desirable to adjust an arrangement relationship of the sample stage, the mask adjustment unit base 116 and the sample mask unit micromotion mechanism 4 in which the sample mask unit 21 is placed so that the processing object 100 is positioned in the vicinity of the central position on a display screen in an initial position of observation. In the case where it is difficult to arrange respective members in the above positional relationship, a function of automatically correcting a displacement amount by the sample stage until the vacuum evacuation in the vacuum chamber is completed is desirably provided.

FIG. 22 is an observation view by the electron microscope (before fine adjustment). A shape of the processing object 100 which is seen as a point in the observation by the optical microscope 40 can be clearly recognized at a suitable magnification when observed by the electron microscope. Here, the sample stage is moved so that the center of the processing object 100 is positioned at the center of the display screen.

FIG. 23 is an observation view by the electron microscope (a state where the ridge line is tilted). When a ridge line 99 of the mask 2 is tilted and the adjustment is difficult, rotation correction is performed by the raster rotation.

After the center of the processing object 100 is aligned with the center of the display screen, and the tilt of the ridge line 99 of the mask 2 is corrected, the R-mechanism 111 of the sample stage is driven to finely adjust the position of the mask 2. When a motor of the R-mechanism is driven, the R-drive shaft 113 is rotated and the R-mechanism is rotated, however, the processing object 100 (sample 3) during observation does not rotate because it is placed on the X-mechanism 110. Moreover, the gear of the mask adjustment gear unit 118 and the mask fine adjustment gear 120 rotate due to the rotation of the R-drive shaft 113, which drives the mask fine adjustment mechanism 26 of the sample mask unit 21. Accordingly, it is possible to align the ridge line 99 of the mask 2 with the center of the processing object 100 by moving the ridge line 99 of the mask 2 while observing the processing object 100 by the electron microscope.

FIG. 24 is an observation view by the electron microscope (after fine adjustment). At the time when the position of the mask 2 is adjusted (the ridge line 99 of the mask 2 is positioned at the center of the processing object 100), the driving of the motor is stopped to thereby complete the fine adjustment. After the fine adjustment, the ridge line 99 of the mask 2 is arranged at the center of the processing object 100 of several μm or less, and the lower half of the processing object 100 is hidden by the mask 2.

After the fine adjustment, the vacuum sample chamber of the electron microscope is released to the air, the mask adjustment gear unit 118 is pushed in the right direction of FIG. 20 so as to be separated from the mask fine adjustment gear 120, and the sample mask unit micromotion mechanism 4 is in state removable from the sample stage (mask adjustment unit base 116) of the electron microscope. Then, the sample mask unit micromotion mechanism 4 provided with the sample mask unit 21 having the mask 2 in which the positional relationship of shielding with respect to the sample 3 is adjusted with high accuracy is removed and mounted on the sample unit base 5 of the ion milling device. After the sample unit base 5 is pushed back to the inside of the vacuum chamber 15, the inside of the vacuum chamber 15 is evacuated and the rotation body 9 is tilted in a reciprocating manner while maintaining the sample unit base 5 in a horizontal state to thereby perform cross-section milling processing.

FIG. 25 is an explanatory view of a method (cross-section milling processing) for preparing an observation cross section in the sample 3 (processing object 100) by the ion beam device.

When the sample 3 to which the mask 2 is closely fixed is irradiated with the argon ion beam while being tilted in the reciprocating manner, the sample 3 (processing object 100) not covered with the mask 2 can be removed in a depth direction along the mask 2, and the surface of the cross section of the sample 3 (processing object 100) can be mirror polished. Accordingly, the observation cross section can be formed in the center of the processing object 100 of several μm or less.

As the positional relationship between the sample 3 and the mask 2 can be adjusted with high accuracy while performing observation by using the electron microscope according to the embodiment, the cross section of a minute processing object of μm or less can be milled in a wide range. To observe the cross section of a TSV (Si through electrode) is becoming important particularly in a semiconductor field in recent years, and it is required to prepare an observation sample having several μm or less in via diameter. Cross-section milling processing can be performed to the processing object of several μm or less according to the embodiment. Furthermore, also in the normal cross-section milling processing in which the place is not specified (cross section processing in which deformation due to scratches or stress is eliminated, not cross section processing of a particular place), processing time can be drastically shortened as a protruding amount (amount of the sample 3 protruding from the mask 2) can be adjusted to several μm or less.

REFERENCE SIGNS LIST

1 . . . ion source, 2 . . . mask, 3 . . . sample, 4 . . . sample mask unit micromotion mechanism, 5 . . . sample unit base, 6 . . . vacuum evacuation system, 7 . . . processing observation window, 8 . . . sample stage, 9 . . . rotation body, 10 . . . flange, 11 . . . linear guide, 12 . . . loupe, 13 . . . loupe micromotion mechanism, 15 . . . vacuum chamber, 21 . . . sample mask unit, 22 . . . sample holder rotation ring, 23 . . . sample holder, 24 . . . linear guide, 25 . . . mask holder, 26 . . . mask fine adjustment mechanism, 27 . . . mask fixing screw, 28 . . . sample holder turning screw, 29 . . . spring, 35 . . . sample holder metal fitting, 36 . . . sample holder fixing mechanism, 40 . . . optical microscope, 41 . . . observation stage, 42 . . . fixed stage, 50 . . . gear, 51 . . . bearing, 52 . . . mask unit fixing portion, 53 . . . shaft coupling, 60 . . . sample stage drawing mechanism, 70 . . . electron source, 71 . . . electron beam, 72 . . . Wehnelt electrode, 73 . . . anode electrode, 74 . . . first crossover, 75 . . . first focusing lens, 76 . . . second focusing lens, 77 . . . second crossover, 78 . . . third crossover, 79 . . . sample, 80 . . . objective aperture, 98 . . . ion beam center, 99 . . . ridge line, 100 . . . processing object, 101 . . . shutter, 110 . . . X-mechanism, 111 . . . R-mechanism, 112 . . . positioning hole, 113 . . . R-drive shaft, 114 . . . R-drive gear, 115 . . . mask adjustment gear, 116 . . . mask adjustment unit base, 117 . . . hole for setting, 118 . . . mask adjustment gear unit, 120 . . . mask fine adjustment gear, 121 . . . rubber washer

The invention claimed is:

1. A mask position adjustment method of ion milling comprising the steps of:
setting a sample mask component capable of adjusting a positional relationship between a sample and a mask on a sample stage of an electron microscope;
connecting a mask position adjustment unit of the sample mask component to an R-axis of the sample stage, which is a rotational axis of the sample stage, so as to adjust the position of the mask by driving the R-axis; and
driving the R-axis while performing observation by the electron microscope to adjust the position of the mask;
wherein the mask is arranged in a mask holder that is moved along a linear guide by rotation of the mask position adjustment unit.

2. The mask position adjustment method according to claim 1,
wherein the mask position adjustment unit and the R-axis are connected through a rotation member, and
the driving of the R-axis is transmitted to the mask position adjustment unit by rotation of the rotation member.

3. The mask position adjustment method according to claim 1,
wherein the sample mask component is installed in a moving mechanism rotatably holding an R-mechanism in the sample stage.

4. The mask position adjustment method according to claim 1,
wherein an observation screen of the electron microscope is adjusted by driving the sample stage in X-axis, Y-axis, Z-axis and T-axis, which is a tilt axis of the sample stage, as well as raster rotation to thereby adjust the position of the mask.

5. An electron microscope capable of adjusting a mask position of an ion milling device comprising:
a sample stage in which a sample mask component capable of adjusting a positional relationship between a sample and a mask is set,
wherein an R-axis of the sample stage, which is a rotational axis of the sample stage, is connected to a mask position adjustment unit of the sample mask component set on the sample stage, and
the position of the mask may be adjusted by driving the R-axis;
wherein the mask is arranged in a mask holder that is moved along a linear guide by rotation of the mask position adjustment unit.

6. The electron microscope according to claim 5,
wherein the sample stage includes a rotation member connecting the mask position adjustment unit to the R-axis, and
the driving of the R-axis is transmitted to the mask position adjustment unit by rotation of the rotation member.

7. The electron microscope according to claim 5,
wherein the sample mask component is installed in a moving mechanism rotatably holding an R-mechanism in the sample stage.

8. The electron microscope according to claim 5,
wherein an observation screen of the electron microscope may be adjusted by driving the sample stage in X-axis, Y-axis, Z-axis and T-axis, which is a tilt axis of the sample stage, as well as raster rotation of the electron microscope while adjusting the mask position by driving the R-axis.

9. A mask adjustment device of ion milling which is set on a sample stage of an electron microscope comprising:
a sample mask component capable of adjusting a positional relationship between a sample and a mask,
wherein a mask position adjustment unit of the sample mask component set in the mask adjustment device is connected to an R-axis of the sample stage, which is a rotational axis of the sample stage, and
the position of the mask is adjusted by driving the R-axis;
wherein the mask is arranged in a mask holder that is moved along a linear guide by rotation of the mask position adjustment unit.

10. The mask adjustment device according to claim 9, further comprising:
a rotation member connecting the mask position adjustment unit to the R-axis,
wherein the driving of the R-axis is transmitted to the mask position adjustment unit by rotation of the rotation member.

11. The mask adjustment device according to claim 9,
wherein the mask adjustment device is installed in a moving mechanism rotatably holding an R-mechanism in the sample stage.

12. The mask adjustment device according to claim 9,
wherein the sample stage is driven in X-axis, Y-axis, Z-axis and T-axis, which is a tilt axis of the sample stage, while adjusting the mask position by driving the R-axis to thereby move the mask.

13. A sample mask component of an ion milling device capable of adjusting a positional relationship between a sample and a mask,
wherein a mask position adjustment unit adjusting the positional relationship between the sample and the mask is connected to an R-axis of the sample stage, which is a rotational axis of the sample stage, when set on a sample stage of an electron microscope, and
the position of the mask is adjusted by driving the R-axis;
wherein the mask is arranged in a mask holder that is moved along a linear guide by rotation of the mask position adjustment unit.

14. The sample mask component according to claim 13,
wherein the mask position adjustment unit is connected to an R-axis through a rotation member, and
the driving of the R-axis is transmitted by rotation of the rotation member.

15. The sample mask component according to claim 13,
wherein the sample mask component is installed in a moving mechanism rotatably holding an R-mechanism in the sample stage.

16. The sample mask component according to claim 13,
wherein the sample stage is driven in X-axis, Y-axis, Z-axis and T-axis, which is a tilt axis of the sample stage, while adjusting the mask position by driving the R-axis to thereby move the mask.

* * * * *